(12) United States Patent
Wang et al.

(10) Patent No.: US 12,459,064 B2
(45) Date of Patent: Nov. 4, 2025

(54) JIG

(71) Applicants: Chengdu BOE Optoelectronics Technology Co., Ltd., Sichuan (CN); BOE Technology Group Co., Ltd., Beijing (CN)

(72) Inventors: Jiaxiang Wang, Beijing (CN); Binfeng Feng, Beijing (CN); Chang Liu, Beijing (CN); Xinqi Lin, Beijing (CN); Xiangdong Wei, Beijing (CN); Jie Yang, Beijing (CN); Fei Li, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 180 days.

(21) Appl. No.: 17/913,800

(22) PCT Filed: Nov. 15, 2021

(86) PCT No.: PCT/CN2021/130559
§ 371 (c)(1),
(2) Date: Sep. 22, 2022

(87) PCT Pub. No.: WO2022/156324
PCT Pub. Date: Jul. 28, 2022

(65) Prior Publication Data
US 2024/0207986 A1    Jun. 27, 2024

(30) Foreign Application Priority Data
Jan. 20, 2021  (CN) .......................... 202110074491.4

(51) Int. Cl.
*B23P 19/04* (2006.01)
*B25B 11/00* (2006.01)
*B25B 11/02* (2006.01)

(52) U.S. Cl.
CPC .............. *B23P 19/04* (2013.01); *B25B 11/00* (2013.01); *B25B 11/02* (2013.01)

(58) Field of Classification Search
CPC .......... B23P 19/04; B25B 11/00; B25B 11/02; B32B 38/1866; B32B 2457/20; B32B 2457/206
(Continued)

(56) References Cited

U.S. PATENT DOCUMENTS

| 4,824,086 A * | 4/1989 | Rickling | F41A 23/00 269/275 |
| 2014/0197057 A1* | 7/2014 | Hogue | F41C 33/06 220/523 |

(Continued)

FOREIGN PATENT DOCUMENTS

| CN | 106471560 A | 3/2017 |
| CN | 107046108 A | 8/2017 |

(Continued)

OTHER PUBLICATIONS

CN 202110074491.4 first office action.
PCT/CN2021/130559 international search report and written opinion.

*Primary Examiner* — Monica S Carter
*Assistant Examiner* — Caleb Andrew Holizna
(74) *Attorney, Agent, or Firm* — IPro, PLLC

(57) ABSTRACT

Provided is a jig, configured for preventing a peeling from occurring at a bending region of a flexible display module, the flexible display module includes a non-bending region, a bending region and a bonding region in a first direction. The jig includes a press-fit structure, and a position limiting (Continued)

structure for limiting a position of and fixing the press-fit structure; the press-fit structure is configured to be arranged at a light-emitting side of the flexible display module, and comprises a press-fit portion for contacting against the bending region and a first connection portion connected to the position limiting structure; and the position limiting structure is configured to be arranged on a backlight side of the flexible display module, and comprises a second connection portion fitted with and connected to the first connection portion.

18 Claims, 5 Drawing Sheets

(58) Field of Classification Search
USPC .......................................................... 269/287
See application file for complete search history.

(56) References Cited

U.S. PATENT DOCUMENTS

| | | | |
|---|---|---|---|
| 2017/0225385 A1 | 8/2017 | Park et al. | |
| 2018/0086034 A1* | 3/2018 | Lee | B41M 7/0027 |
| 2019/0186837 A1* | 6/2019 | Fukada | F28F 9/0256 |
| 2019/0348641 A1 | 11/2019 | Jung et al. | |
| 2020/0144559 A1 | 5/2020 | Zhang | |
| 2022/0126408 A1 | 4/2022 | Deng et al. | |
| 2022/0288909 A1 | 9/2022 | Liu et al. | |

FOREIGN PATENT DOCUMENTS

| | | | |
|---|---|---|---|
| CN | 207895780 U | | 9/2018 |
| CN | 108615464 A | | 10/2018 |
| CN | 109243308 A | | 1/2019 |
| CN | 110065220 A | | 7/2019 |
| CN | 110649058 A | | 1/2020 |
| CN | 110930882 A | | 3/2020 |
| CN | 111223803 A | | 6/2020 |
| CN | 111546750 A | | 8/2020 |
| CN | 111682128 A | | 9/2020 |
| CN | 111697165 A | | 9/2020 |
| CN | 111823558 A | | 10/2020 |
| CN | 111833739 A | | 10/2020 |
| CN | 111981275 A | | 11/2020 |
| CN | 211929702 U | * | 11/2020 |
| CN | 112123911 A | | 12/2020 |
| CN | 112150932 A | | 12/2020 |
| CN | 112165803 A | | 1/2021 |
| CN | 112863351 A | | 5/2021 |
| JP | 2005310911 A | | 11/2005 |
| JP | 2010254439 A | | 11/2010 |
| JP | 2014022504 A | | 2/2014 |

* cited by examiner

JIG

CROSS-REFERENCE TO RELATED APPLICATIONS

The present application is the U.S. national phase of PCT Application No. PCT/CN2021/130559 filed on Nov. 15, 2021, which claims priority to Chinese Patent Application No. 202110074491.4 filed in China on Jan. 20, 2021, which is hereby incorporated by reference in its entirety.

TECHNICAL FIELD

The present disclosure relates to the technical field of manufacturing display products, and in particular, to a jig.

BACKGROUND

With the developing of communication technologies, portable display devices, such as a mobile phone and a wearable device, are widely used. In order to ensure the portability of display devices, a display device that is foldable and rollable becomes favorable. For a better appearance with symmetry, the display module may be designed to include an edge region in a curved state, and the attached display module would gradually separate at a glue layer with a weak cohesive force due to the existence of a rebound force, resulting in a poor appearance and size, and thus cannot be assembly to a client device. This may also cause the bending region (bonding region) to be pulled, resulting in a crack in wirings at the bending region which may in turn cause a poor display. There may be a high risk and possibility for a peeling occurring at the edge region, especially when the display module is in the process of shipment and storing in the warehouse for the client device. A conventional clamping solution cannot be used, since the edge region is also the wiring region and there is a high risk for a poor display if such region is touched.

SUMMARY

In order to address the technical issue, the present disclosure provides a jig for addressing the technical issue that the peeling may easily occur at the edge of the flexible display module.

To achieve this, embodiments of the present disclosure provide the following technical solution. A jig, configured to prevent a peeling from occurring at a bending region of a flexible display module, the flexible display module including a non-bending region, a bending region and a bonding region arranged in a first direction, the jig includes a press-fit structure, and a position limiting structure for limiting a position of the press-fit structure and fixing the press-fit structure;

the press-fit structure is configured to be arranged at a light-emitting side of the flexible display module, the press-fit structure comprises a press-fit portion for contacting against the bending region, and a first connection portion connected to the position limiting structure; and the position limiting structure is configured to be arranged at a backlight side of the flexible display module, the position limiting structure comprises a second connection portion fitted with and connected to the first connection portion.

Optionally, when the press-fit portion contacts against the bending region of the flexible display module, the first connection portion is parallel to the non-bending region, and a contacting surface of the press-fit portion for contacting against the bending region is tangential to the bending region.

Optionally, a cross section of the second connection portion in a direction perpendicular to the first direction is a U-shape, the second connection portion includes a central region and connection regions located at two opposite sides of the central region, a distance between the central region and the first connection portion is greater than the height of the flexible display module in the direction perpendicular to the first direction, so that when the press-fit portion contacts against the bending region of the flexible display module, a gap is provided between the first connection portion and the flexible display module, and a gap is provided between the central region and the flexible display module.

Optionally, the first connection portion is a U-shape, and the first connection portion includes a first portion connected to the press-fit portion, and two second portions symmetrically arranged at two opposite sides of the first portion, wherein the two second portions are in one-to-one correspondence to the two connection regions, and the second portion and the corresponding connection region are arranged to be dislocated with each other:

each of the second portions is provided with a first groove, the first groove is arranged to extend through the second portion in the first direction, each of the connection regions is provided with a second groove corresponding to the first groove, and the jig further includes an elastic bonding band arranged to surround the first groove and the corresponding second groove.

Optionally, a position limiting hole is provided in the second portion, and a position limiting pillar is provided on the connection region corresponding to the second portion, the position limiting pillar is capable of cooperating with the position limiting hole.

Optionally, the position limiting hole is a strip-shaped position limiting hole extending in the first direction, and two position limiting pillars including the position limiting pillar are provided on each of the connection regions in the first direction.

Optionally, the flexible display module includes a flexible display substrate and a support plate for supporting the flexible display substrate, wherein the support plate includes a first region corresponding to the non-bending region:

the position limiting structure further includes a fixing portion fixed to the first region of the support plate, the fixing portion and the connection regions of the second connection portion are located in the same plane, and an end of the fixing portion is connected to the central region via a connecting plate which is obliquely arranged.

Optionally, the connection regions each includes an adhesive region for a connection to the support plate.

Optionally, the position limiting structure further includes a protective portion, an end of the protective portion is connected to the central region, the protective portion and the central region forms an L-shaped structure, the press-fit portion includes the contacting surface for contacting against the bending region of the flexible display module, the protective portion is located at a side of the press-fit portion away from the contacting surface, and a gap is provided between the protective portion and the press-fit portion.

Optionally, the contacting surface of the press-fit portion for contacting with the bending region of the flexible display module is provided with an elastic member.

Optionally, the elastic member is made of foam.

The present disclosure has the following beneficial effects: by means of the cooperation between the press-fit structure and the position limiting structure, a press-fit force is provided to the bending region of the flexible display module so as to prevent the occurrence of the peeling phenomenon in the bending region.

DETAILED DESCRIPTION

To make the object, technical solution and advantages of the embodiments of the present disclosure more clear, a detailed description for the embodiments of the present disclosure will be illustrated in conjunction with the appended drawings. It is to be understood that the described embodiments are merely some, but not all, of the embodiments of the present disclosure. Based on the embodiments described in the present disclosure, all other embodiments obtained by a person of ordinary skill in the art without inventive effort fall within the scope of the present disclosure.

In the description of the present disclosure, it should be noted that the terms "central", "upper", "lower", "left", "right", "vertical", "horizontal", "inner", "outer", and the like indicate an orientation or a positional relationship based on the orientation or positional relationship as shown in the figures, which merely facilitate and simplify the description of the present disclosure and do not indicate or imply that the referenced devices or elements must have such particular orientation, or be constructed and operated in such particular orientation, and thus should not be construed as a limitation for the present disclosure. Furthermore, the terms "first", "second", and "third" are used for descriptive purposes only and are not to be construed as indicating or implying relative importance.

As shown in FIGS. 1-12, embodiments of the present disclosure provide a jig, configured for preventing a peeling from occurring at a bending region of a flexible display module, where the flexible display module includes a non-bending region 300, a bending region 100 and a bonding region 200 arranged along a first direction. The jig includes a press-fit structure, and a position limiting structure for limiting a position of the press-fit structure and fixing the press-fit structure.

The press-fit structure is configured to be arranged at a light-emitting side of the flexible display module. The press-fit structure includes a press-fit portion and a first connection portion 11, the press-fit portion is configured for contacting against the bending region 100, and the first connection portion 11 is connected to the position limiting structure.

The position limiting structure is configured to be arranged at a backlight side of the flexible display module. The position limiting structure includes a second connection portion fitted with and connected to the first connection portion 11.

Figure 1:
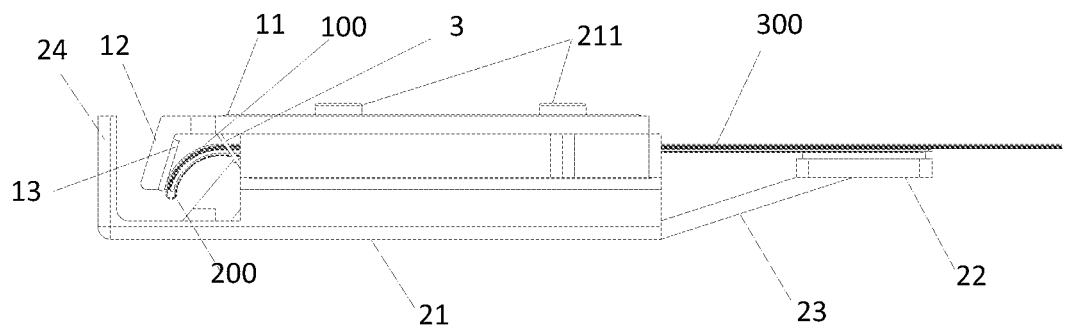
FIG. 1 is a schematic diagram showing a jig and a flexible display module in an assembled state in an embodiment of the present disclosure.
Figure 2:
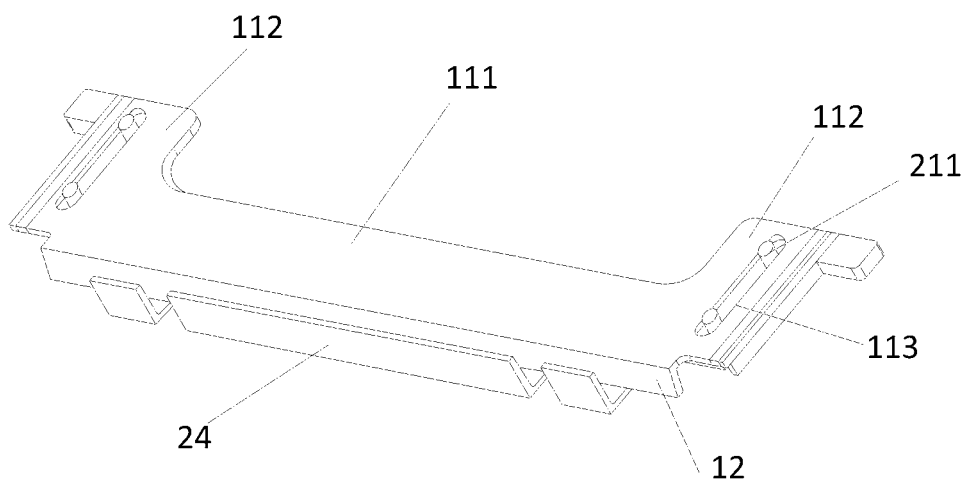
FIG. 2 is a first schematic diagram showing a structure of a jig in an embodiment of the present disclosure.
Figure 3:
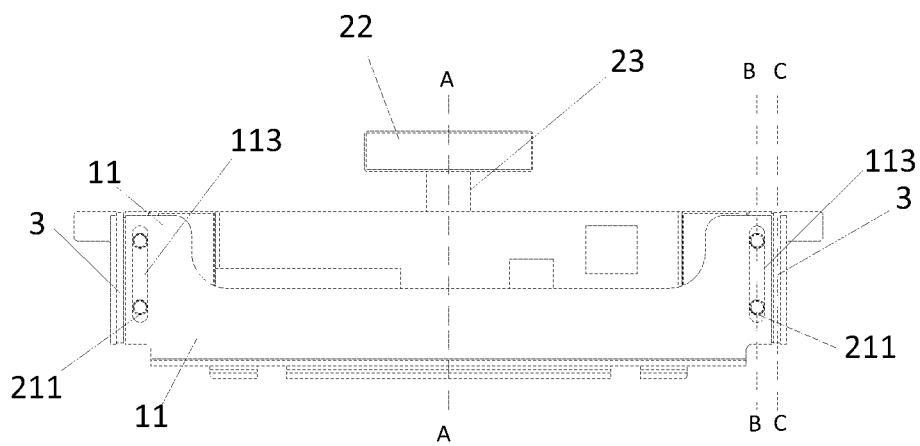
FIG. 3 is a second schematic diagram showing a structure of a jig in an embodiment of the present disclosure.
Figure 4:
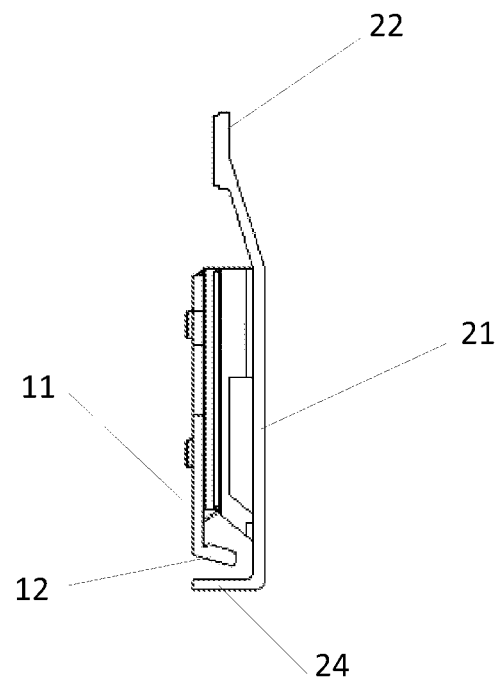
FIG. 4 is a schematic diagram for a cross-section taken along A-A in FIG. 3.
Figure 5:
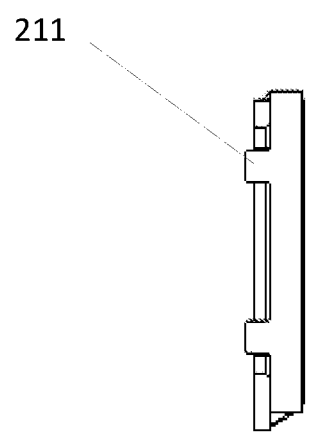
FIG. 5 is a schematic diagram for a cross-section taken along B-B in FIG. 3.
Figure 6:
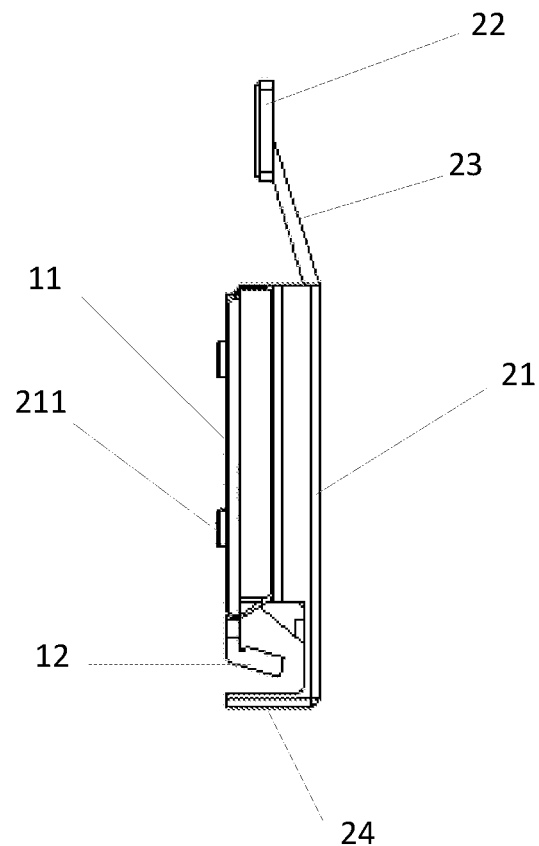
FIG. 6 is a schematic diagram for a cross-section taken along C-C in FIG. 3.
Figure 7:
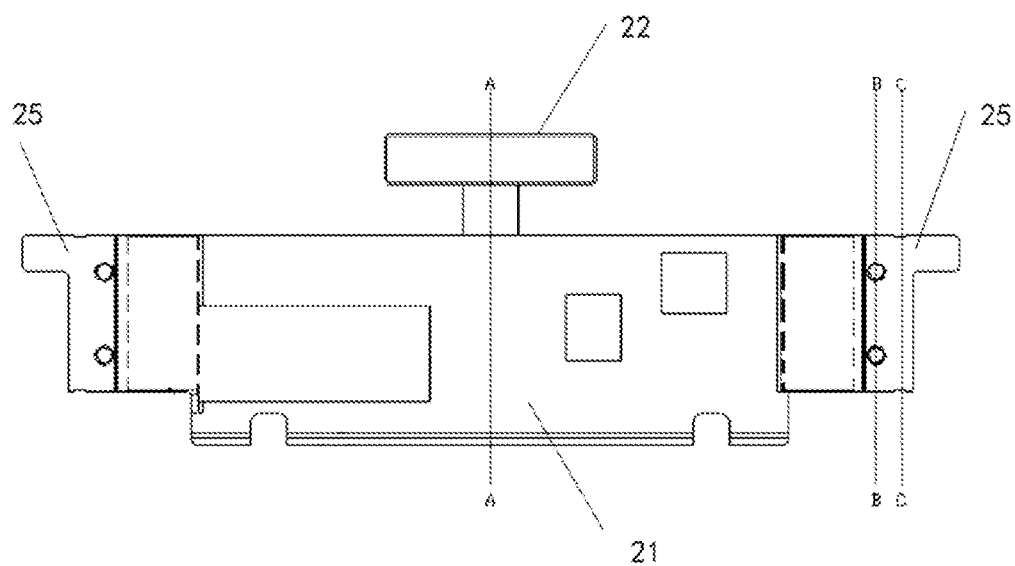
FIG. 7 is a schematic diagram showing a position limiting structure in an embodiment of the present disclosure.
Figure 8:
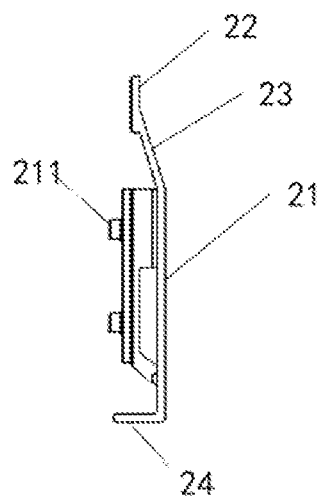
FIG. 8 is a schematic diagram for a cross-section taken along A-A in FIG. 7.
Figure 9:
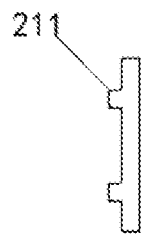
FIG. 9 is a schematic diagram for a cross-section taken along B-B in FIG. 7.
Figure 10:
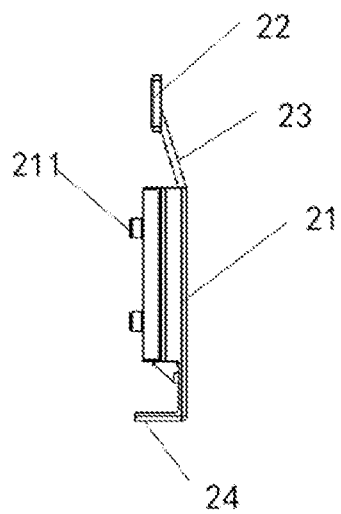
FIG. 10 is a schematic diagram for a cross-section taken along C-C in FIG. 7.
Figure 11:
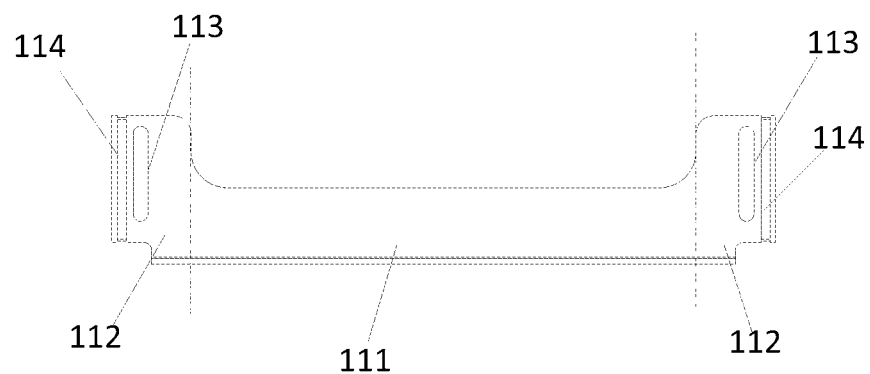
FIG. 11 is a first schematic diagram showing a press-fit structure in an embodiment of the present disclosure.
Figure 12:
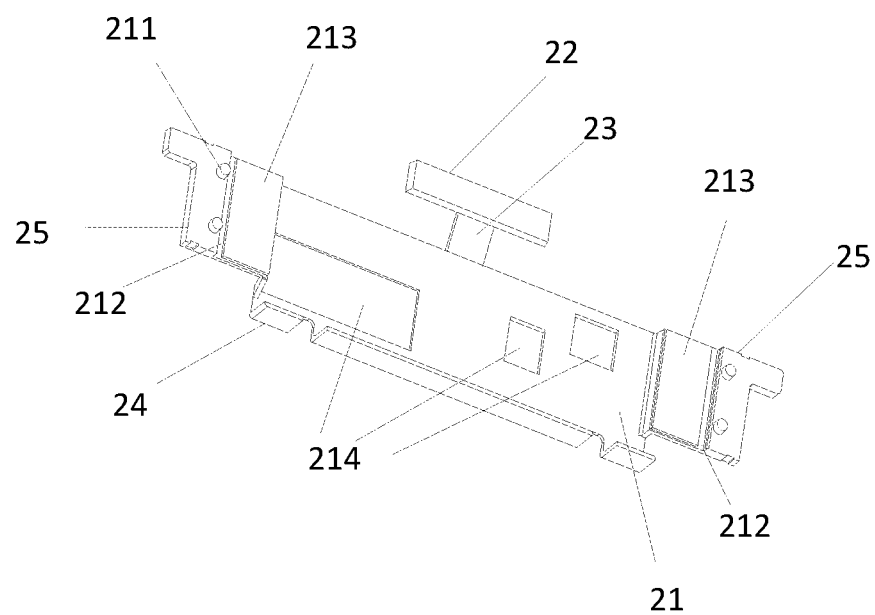
FIG. 12 is a second schematic diagram showing a press-fit structure in an embodiment of the present disclosure.

FIG. 1 is a schematic diagram showing the status where the jig and the flexible display module have been assembled. By the press-fit structure contacting against the bending region 100, a pressing force is provided to the bending region 100 of the flexible display module, so as to prevent the peeling phenomenon from being occurred at the bending region 100.

Illustratively, in the embodiment, when a press-fit portion 12 abuts against the bending region 100 of the flexible display module, the first connection portion 11 is arranged to be parallel to the non-bending region 300, and a contacting surface of the press-fit portion 12 for contacting against the bending region 100 is tangential to the bending region 100

As shown in FIG. 1, the contacting surface of the press-fit portion 12 for contacting against the bending region 100 is arranged to be tangential to the bending region 100, namely, the press-fit portion 12 only abuts against the bending region 100, and does not contact with the bonding region 200 of the flexible display module, so as to avoid a damage to the bonding region 200.

The flexible display module includes a flexible display substrate. The flexible display substrate includes a display region, and the bonding region 200 is located at one side near the display region and bends at a backlight side of the flexible display substrate. The bonding region 200 is provided with a flexible circuit board and a Chip on Film. The press-fit portion does not contact with the bonding region 200 of the flexible display module, thereby avoiding damages to the flexible circuit board and the Chip on Film.

Illustratively, in the embodiment, the cross section of the second connection portion in a direction perpendicular to the first direction is a U shape, the second connection portion includes a central region 21 and connection regions 25 located at two opposite sides of the central region 21, a distance between the central region 21 and the first connection portion 11 is greater than the height of the flexible display module in the direction perpendicular to the first direction, so that when the press-fit portion 12 contacts against the bending region 100 of the flexible display module, a gap is provided between the first connection portion 11 and the flexible display module, and a gap is provided between the central region 21 and the flexible display module.

The cross section of the second connection portion in the direction perpendicular to the first direction being a U shape means that the second connection portion is a structure having a lower central section and higher sections at two ends, a first space is formed by the enclosure of the position limiting structure and the press-fit structure. The bending region 100 of the flexible display module contacts against the press-fit portion 12, while the remaining part of the flexible display module housed in the first space is not in contact with the position limiting structure and the press-fit structure, so that the light-emitting surface of the flexible display panel can be prevented from being scratched by the press-fit structure, and a damage to a components such as an IC (integrated circuit) on the bonding region 200 caused by the position limiting structure can also be prevented.

Illustratively, in the embodiment, the first connection portion 11 is U-shaped. The first connection portion 11 includes: a first portion 111 connected to the press-fit portion 12: and two second portions 112 symmetrically arranged at two opposite sides of the first portion 111, where the two second portions 112 are in one-to-one correspondence to the two connection regions 25, and the second portion 112 and the corresponding connection regions 25 are arranged to be dislocated with each other, that is, not exactly opposite to each other.

The second portion 112 is provided with a first groove 114, the first groove 114 is arranged to be extending in the first direction through the second portion 112, the connection region 25 is provided with a second groove 212 corresponding to the first groove 114. The jig further includes an elastic binding band 3 arranged to surround the first groove 114 and the corresponding second groove 212.

By binding the second portion 112 and the corresponding connection region 25 with the elastic binding band 3, and arranging the second portion 112 and the corresponding connection region 25 to be dislocated with each other, a press-fit force is provided to the press-fit portion 12, and in turn, a press-fit force is provided to the bending region 100, which can effectively prevents the peeling phenomenon from occurring at the bending region 100.

Illustratively, in the embodiment, a position limiting hole 113 is provided in the second portion 112, and a position limiting pillar 211, which is capable of cooperating with the position limiting hole 113, is provided on the connection region 25 corresponding to the second portion 112.

The arrangement of the position limiting hole 113 and the position limiting pillar 211 can facilitate the assembly of the press-fit structure and the position limiting structure.

Illustratively, in the embodiment, the position limiting hole 113 is a strip-shaped position limiting hole extending in the first direction, and two position limiting pillars 211 are provided on the connection region 25 along the first direction.

The two position limiting pillars 211 are respectively arranged at two ends of the strip-shaped position limiting hole 113. Gaps are provided between the two position limiting pillars 211 and the strip-shaped position limiting hole in the extending direction of the position limiting hole. The gaps facilitate the insertion of the position limiting pillars into the position limiting hole, and interference therefor can be avoided.

The flexible display module includes a flexible display substrate and a support plate for supporting the flexible display substrate, wherein the support plate includes a first region corresponding to the non-bending region 300.

The position limiting structure further includes a fixing portion 22 fixed to the first region of the support plate, the fixing portion 22 and the connection region 25 of the second connection portion are located in the same plane, and one end of the fixing portion 22 is connected to the central region 21 via a connecting plate 23 which is obliquely arranged.

Illustratively, in the embodiment, the connection region 25 includes an adhesive region 213 for a connection to the support plate.

The position limiting structure is connected to the support plate via the fixing portion 22, and is connected to the support plate via the adhesive region 213 on the connection region 25, so as to improve the stability of the connection for the position limiting structure.

The connection between the position limiting structure and the support plate may be, but is not limited to, a bonding by an adhesive.

Illustratively, in the embodiment, the position limiting structure further includes a protective portion 24. One end of the protective portion 24 is connected to the central region 21, and the protective portion 24 and the central region 21 forms an L-shaped structure, the press-fit portion 12 includes a contacting surface for contacting against the bending region 100 of the flexible display module, the protective portion 24 is located at a side of the press-fit portion 12 away from the contacting surface, and a gap is provided between the protective portion 24 and the press-fit portion 12.

By arranging the protective portion 24, the press-fit portion 12 can be protected, and in addition, by providing a gap between the protective portion 24 and the press-fit portion 12, damage to the bonding region can be avoided.

It should be noted that the position limiting structure is further provided with an avoiding hole 214 for keeping away from other components, so as to avoid an interference with other component.

Illustratively, in the embodiment, an elastic member 13 is provided at a surface of the press-fit portion 12 contacting with the bending region 100. By providing the elastic member 1, a certain buffer force can be provided to avoid the damage to the body of the module.

Illustratively, in the embodiment, the elastic member 13 is made of foam.

While the foregoing is directed to the embodiments of the present disclosure, it will be understood that various modifications and adaptations may be made by those skilled in the art without departing from the principle of the disclosure, and such modifications and adaptations fall within the scope of the disclosure.

What is claimed is:

1. A jig, applied to a flexible display module, the flexible display module comprising a non-bending region, a bending region and a bonding region arranged in a first direction, wherein the jig comprises a press-fit structure, and a position limiting structure for limiting a position of the press-fit structure and fixing the press-fit structure, and the jig is configured to prevent a peeling from occurring at the bending region;

wherein the press-fit structure is configured to be arranged at a light-emitting side of the flexible display module, the press-fit structure comprises a press-fit portion for contacting against the bending region, and a first connection portion connected to the position limiting structure; and the position limiting structure is configured to be arranged at a backlight side of the flexible display module, the position limiting structure comprises a second connection portion fitted with and connected to the first connection portion; wherein a cross section of the second connection portion in a direction perpendicular to the first direction is a U-shape, the second connection portion comprises a central region and connection regions located at two opposite sides of the central region;

the flexible display module comprises a flexible display substrate and a support plate for supporting the flexible display substrate, wherein the support plate comprises a first region corresponding to the non-bending region;

the position limiting structure further comprises a fixing portion fixed to the first region of the support plate, the fixing portion and the connection region of the second connection portion are located in the same plane, and an end of the fixing portion is connected to the central region via a connecting plate which is obliquely arranged.

2. The jig according to claim 1, wherein when the press-fit portion contacts against the bending region of the flexible display module, the first connection portion is parallel to the non-bending region, and a contacting surface of the press-fit portion for contacting against the bending region is tangential to the bending region.

3. The jig according to claim 2, wherein a distance between the central region and the first connection portion is greater than the height of the flexible display module in the direction perpendicular to the first direction, so that when the press-fit portion contacts against the bending region of the flexible display module, a gap is provided between the first connection portion and the flexible display module, and a gap is provided between the central region and the flexible display module.

4. The jig according to claim 3, wherein the first connection portion is a U-shape, the first connection portion comprises a first portion connected to the press-fit portion and two second portions symmetrically arranged at two opposite sides of the first portion, wherein the two second portions are in one-to-one correspondence to the two connection regions, and the second portion and the corresponding connection region are arranged to be dislocated with each other;

each of the second portions is provided with a first groove, the first groove is arranged to extend through the second portion in the first direction, each of the connection regions is provided with a second groove corresponding to the first groove, and the jig further comprises an elastic bonding band arranged to surround the first groove and the corresponding second groove.

5. The jig according to claim 4, wherein a position limiting hole is provided in the second portion, and a position limiting pillar is provided on the connection region corresponding to the second portion, the position limiting pillar is capable of cooperating with the position limiting hole.

6. The jig according to claim 5, wherein the position limiting hole is a strip-shaped position limiting hole extending in the first direction, and two position limiting pillars including the position limiting pillar are provided on each of the connection regions in the first direction.

7. The jig according to claim 2, wherein the contacting surface of the press-fit portion for contacting with the bending region of the flexible display module is provided with an elastic member.

8. The jig according to claim 7, wherein the elastic member is made of foam.

9. The jig according to claim 1, wherein the connection regions each comprises an adhesive region for a connection to the support plate.

10. The jig according to claim 9, wherein the position limiting structure further comprises a protective portion, an end of the protective portion is connected to the central region, the protective portion and the central region forms an L-shaped structure, the press-fit portion comprises the contacting surface for contacting against the bending region of the flexible display module, the protective portion is located at a side of the press-fit portion away from the contacting surface, and a gap is provided between the protective portion and the press-fit portion.

11. An assembly, comprising:
a flexible display module comprising a non-bending region, a bending region and a bonding region arranged in a first direction; and
a jig assembled with the flexible display module, wherein the jig is configured to prevent a peeling from occurring at the bending region, and the jig comprises:
a press-fit structure; and
a position limiting structure for limiting a position of the press-fit structure and fixing the press-fit structure;
wherein the press-fit structure is configured to be arranged at a light-emitting side of the flexible display module, the press-fit structure comprises a press-fit portion for contacting against the bending region, and a first connection portion connected to the position limiting structure; and
the position limiting structure is configured to be arranged at a backlight side of the flexible display module, the position limiting structure comprises a second connection portion fitted with and connected to the first connection portion; wherein
a cross section of the second connection portion in a direction perpendicular to the first direction is a U-shape, the second connection portion comprises a central region and connection regions located at two opposite sides of the central region;
the flexible display module comprises a flexible display substrate and a support plat
e for supporting the flexible display substrate, wherein the support plate comprises a first region corresponding to the non-bending region;
the position limiting structure further comprises a fixing portion fixed to the first region of the support plate, the fixing portion and the connection region of the second connection portion are located in the same plane, and an end of the fixing portion is connected to the central region via a connecting plate which is obliquely arranged.

12. The assembly according to claim 11, wherein when the press-fit portion contacts against the bending region of the flexible display module, the first connection portion is parallel to the non-bending region, and a contacting surface of the press-fit portion for contacting against the bending region is tangential to the bending region.

13. The assembly according to claim 12, wherein a distance between the central region and the first connection portion is greater than the height of the flexible display module in the direction perpendicular to the first direction, so that when the press-fit portion contacts against the bending region of the flexible display module, a gap is provided between the first connection portion and the flexible display module, and a gap is provided between the central region and the flexible display module.

14. The assembly according to claim 13, wherein the first connection portion is a U-shape, the first connection portion comprises a first portion connected to the press-fit portion and two second portions symmetrically arranged at two opposite sides of the first portion, wherein the two second portions are in one-to-one correspondence to the two connection regions, and the second portion and the corresponding connection region are arranged to be dislocated with each other;

each of the second portions is provided with a first groove, the first groove is arranged to extend through the second portion in the first direction, each of the connection regions is provided with a second groove corresponding to the first groove, and the jig further comprises an elastic bonding band arranged to surround the first groove and the corresponding second groove.

15. The assembly according to claim 14, wherein a position limiting hole is provided in the second portion, and a position limiting pillar is provided on the connection region corresponding to the second portion, the position limiting pillar is capable of cooperating with the position limiting hole.

16. The assembly according to claim 15, wherein the position limiting hole is a strip-shaped position limiting hole extending in the first direction, and two position limiting pillars including the position limiting pillar are provided on each of the connection regions in the first direction.

17. The assembly according to claim 12, wherein the contacting surface of the press-fit portion for contacting with the bending region of the flexible display module is provided with an elastic member.

18. The assembly according to claim 11, wherein the position limiting structure further comprises a protective portion, an end of the protective portion is connected to the central region, the protective portion and the central region forms an L-shaped structure, the press-fit portion comprises the contacting surface for contacting against the bending region of the flexible display module, the protective portion is located at a side of the press-fit portion away from the contacting surface, and a gap is provided between the protective portion and the press-fit portion.

* * * * *